United States Patent
Shih et al.

(10) Patent No.: US 8,551,881 B2
(45) Date of Patent: Oct. 8, 2013

(54) METHOD OF BEVEL TRIMMING THREE DIMENSIONAL SEMICONDUCTOR DEVICE

(75) Inventors: Shing-Yih Shih, Taoyuan (TW); Yi-Nan Chen, Taoyuan (TW); Hsien-Wen Liu, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 194 days.

(21) Appl. No.: 13/093,735

(22) Filed: Apr. 25, 2011

(65) Prior Publication Data

US 2012/0270394 A1 Oct. 25, 2012

(51) Int. Cl.
*H01L 21/44* (2006.01)

(52) U.S. Cl.
USPC ............ 438/667; 438/459; 257/E21.576

(58) Field of Classification Search
USPC ................. 438/667, 459; 257/E21.576
See application file for complete search history.

(56) References Cited

U.S. PATENT DOCUMENTS 7,883,991 B1 * 2/2011 Wu et al. .............. 438/459

* cited by examiner

*Primary Examiner* — Zandra Smith
*Assistant Examiner* — Toniae Thomas

(57) ABSTRACT

A method of bevel trimming a three dimensional (3D) semiconductor device is disclosed, comprising providing a substrate with stack layers thereon and through substrate vias (TSV) therein, wherein an edge of the substrate is curved, performing a bevel trimming step to the curved edge of the substrate for obtaining a planar edge, and thinning the substrate to expose the through substrate vias.

20 Claims, 7 Drawing Sheets

METHOD OF BEVEL TRIMMING THREE DIMENSIONAL SEMICONDUCTOR DEVICE

BACKGROUND OF THE INVENTION

1. Field of the Invention

This invention generally relates to a method for fabricating a semiconductor device and more particularly to a method of bevel trimming a three dimensional (3D) semiconductor device.

2. Description of the Related Art

Since the invention of integrated circuit, the semiconductor industry has experienced continued rapid growth due to continuous improvements in the integration density of various electronic components (i.e., transistors, diodes, resistors, capacitors, etc.). For most part, this improvement in integration density has come from repeated reductions in minimum feature sizes, which allows more components to be integrated into a given area.

These integration improvements are essentially two-dimensional (2D) in nature, in that the volume occupied by the integrated components is essentially on the surface of the semiconductor wafer. Although dramatic improvements in lithography have resulted in considerable improvements in two dimensional (2D) integrated circuit formation, there are physical limits to the density that can be achieved in two dimensions. One of these limits is the minimum size needed to make these components. Also, when more devices are put into one chip, more complex designs are required.

An additional limit comes from the significant increase in the number and the length of interconnections between devices as the number of devices increases. When the number and length of interconnections increase, both circuit RC delay and power consumption increases. Three-dimensional (3D) integrated circuits (ICs) are therefore created to resolve the above-discussed limitations. In a typical formation of a 3D IC, wafer thinning is an important process. FIG. 1A-FIG. 1B show one issue generated from the wafer thinning process when fabricating a three dimensional semiconductor device. Referring to FIG. 1A, a wafer 102 which has curve-shaped edges is provided. A device structure 104 comprising stack layers (not shown) is formed on the wafer 102 for forming integrated circuits. Next, referring to FIG. 1B, the wafer 102 is thinned by grinding. Due to the curve-shaped edges, the wafer 102 has a sharp edge 106 after thinning. The wafer with a sharp edge is likely to crack along defects. Further, it is dangerous to carry the wafer 102 with the sharp edge.

BRIEF SUMMARY OF INVENTION

A method of bevel trimming a 3D semiconductor device is disclosed, comprising, providing a substrate with stack layers thereon and through substrate vias (TSV) therein, wherein an edge of the substrate is curved, performing a bevel trimming step to the curved edge of the substrate for obtaining a planar edge, and thinning the substrate to expose the through substrate vias.

A method of bevel trimming a 3D semiconductor device is disclosed, comprising, providing a wafer with stack layers thereon and through substrate vias (TSV) therein to constitute a 3D semiconductor device, wherein an edge of the wafer is curved, performing a bevel trimming step to the curved edge of the wafer for obtaining a planar edge, and thinning the substrate to expose the through substrate vias, wherein the planar edge of the substrate is perpendicular to a surface of the substrate.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1A:
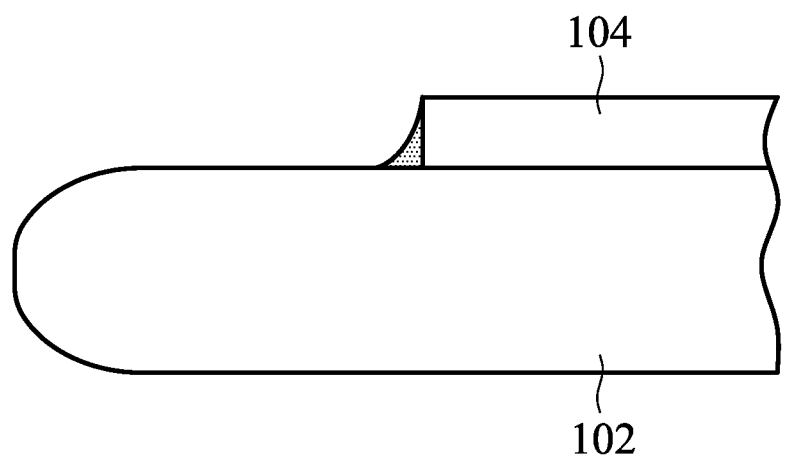
FIGS. 1A-1B show one issue generated when thinning a wafer when fabricating a three dimensional semiconductor device.
Figure 1B:
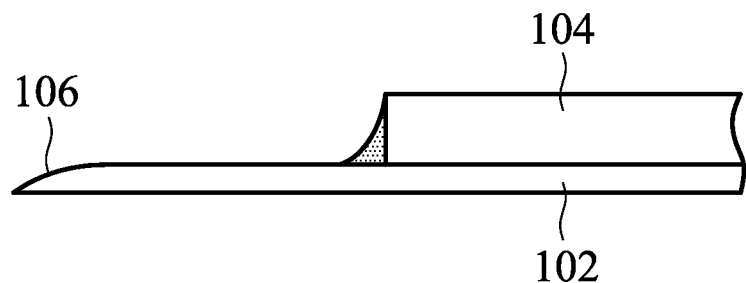
Figure 2A:
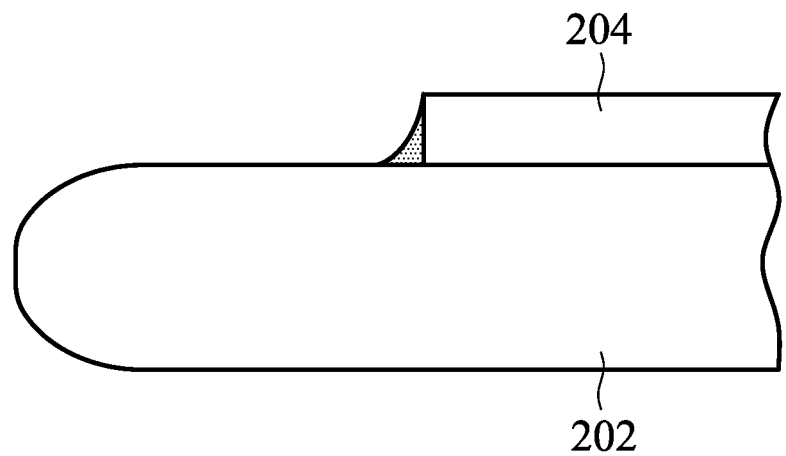
FIGS. 2A-2C show a method of avoiding a sharp edge of a wafer during thinning known by the inventor.
Figure 2B:
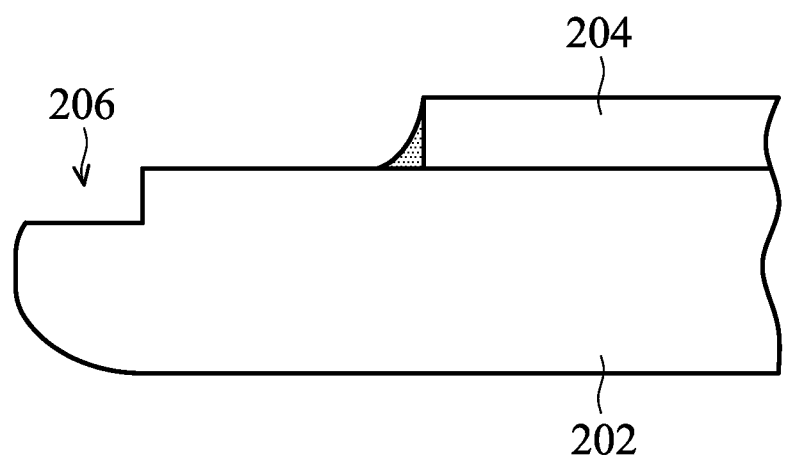
Figure 2C:
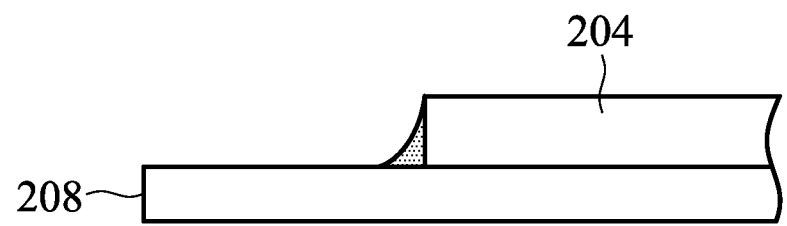

A method of avoiding forming a sharp edge during thinning of a wafer known by the inventor is illustrated in accordance with FIG. 2A-FIG. 2C. First, referring to FIG. 2A, a wafer 202 which has a curved edge is provided. A device structure 204 comprising stack layers is formed on the wafer 202 for forming integrated circuits. Referring to FIG. 2B, the wafer 202 is cut at an edge to form an L shaped opening 206. Thereafter, the wafer 202 is thinned by grinding and due to the L shaped opening 206 at the edge, the thinned wafer 202 can have a planar edge 208 to eliminate the issues from sharp edges, as shown in FIG. 3C. However, cutting the wafer 202 at edges may generate defects and particles in the wafer 202 and another issue may be generated due to the defects and particles.

Figure 3A:
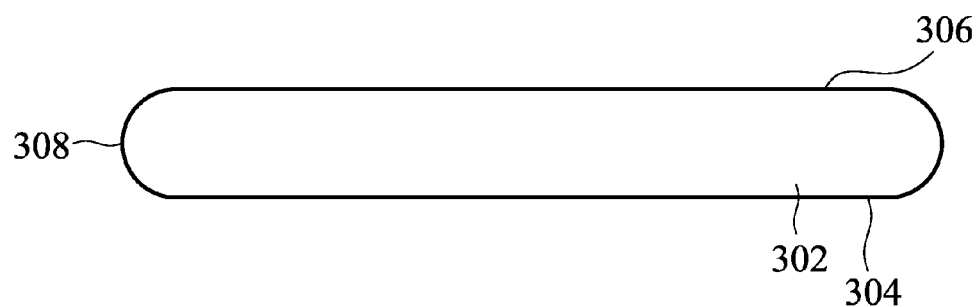
FIGS. 3A-3D show a method of bevel trimming a 3D semiconductor device for eliminating the issue of sharp edges of a wafer of an embodiment of the invention.
Figure 3B:
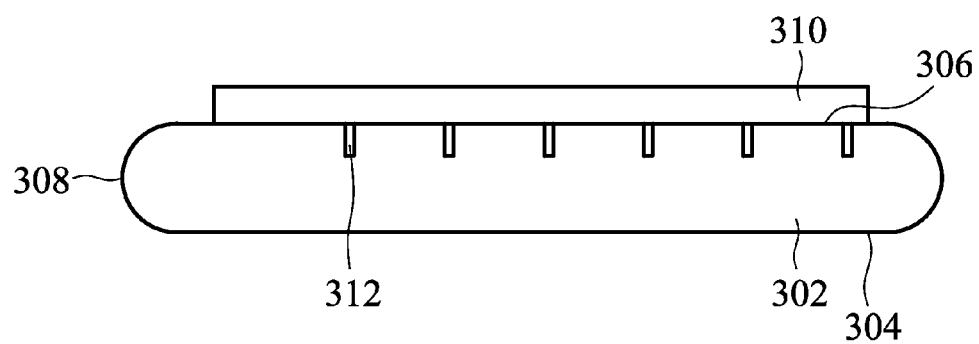
Figure 3C:
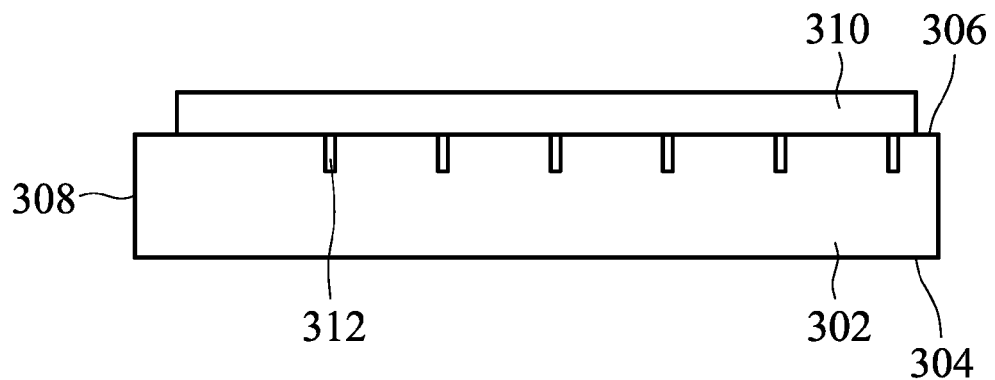

A method of bevel trimming a three dimensional (3D) semiconductor device for eliminating the issue of a sharp edge of a wafer of an embodiment of the invention is illustrated in accordance with FIG. 3A-FIG. 3D. First, referring to FIG. 3A, a substrate 302 which has an edge 308, a front surface 306 and a back surface 304 is provided. In an embodiment of the invention, the substrate 302 is a wafer and the edge 308 of the wafer 302 is curve shaped. The substrate 302 comprises semiconductor wafers such as silicon, gallium arsenide, a rock crystal wafer, sapphire, glass, and the like. In a preferred embodiment of the invention, the substrate 302 is formed of silicon. Referring to FIG. 3B, through substrate vias 312 (TSV) are formed in the substrate 302 and a device structure 310 comprising stack layers are formed on the substrate 302. Formations of the device structure 310 comprising stack layers and the through substrate vias 312 are more clearly illustrated in accordance with FIG. 4A-FIG. 4C.

Figure 4A:
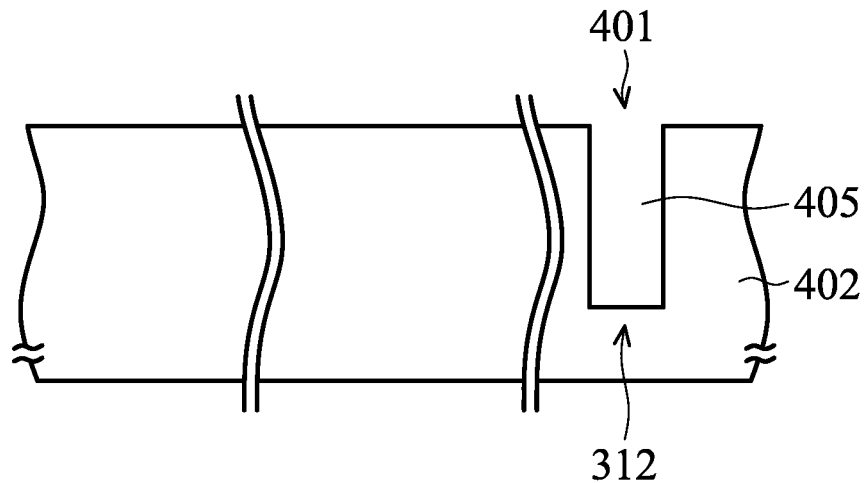
FIGS. 4A-4C show enlarged views to more clearly illustrate formation of stack layers of a device structure.

Referring to FIG. 4A, holes 401 (only one hole is shown for simplicity) are formed in the substrate 302. In an embodiment of the invention, the method for forming the holes 401 comprises performing a lithography process and an etching process in sequence. Subsequently, referring to FIG. 4B, a conductive layer 405 is formed on the substrate 402 and fills the holes 401. The material of the conductive layer 405 may be cupper, tungsten, titanium or other high conductivity materials. The method for forming the conductive layer can be plasma vapor deposition (PVD) or chemical vapor deposition (CVD). Next, referring to FIG. 4C, the conductive layer 405 outside of the holes 401 is removed, so that the conductive layer 405 is left in the holes 401 for forming through substrate vias 304.

Next, semiconductor processes are performed on the substrate 402 at the front side 404 to form stack layers of the device structure 310. For example, a semiconductor device 414, a dielectric layer 416, an interconnect 419, a pad 422 and a passivation layer 424 are formed on the substrate 402 at the front side 404. The semiconductor device 414 may be an MOS transistor. More specifically, the semiconductor device 414 may include a gate dielectric layer 410 and a gate electrode 412 sequentially formed on the substrate 402, and may include source/drain regions 408 deployed in the substrate 402 at both sides of the gate electrode 412. The interconnect 419 includes conductive lines 420 and plugs 418 deployed in different layers, respectively. The materials of the semiconductor device 414, the dielectric layer, the interconnect 419, the pad 422 and the passivation layer 424, and the respective forming methods thereof are known by one of ordinary skill in the art, and thus, the details thereof are not described herein. It is noted that through substrate vias (TSV) can electrically connect to the semiconductor device 414 by the conductive lines 420 and the plugs 418 of the interconnect 419, and the pad 422 can connect outside.

Referring back to FIG. 3C, a bevel trimming process is performed to the edges 308 of the substrate 302. In an embodiment of the invention, the bevel trimming process is a vertical grinding process (bevel polishing), so that the edge 308 of the substrate 302 is modified from a curved shape to a planar shape and the planar edge 308 is preferably perpendicular to the front surface 306 and the back surface 304 of the substrate 302, as shown in FIG. 3C. It is noted that a time control of the bevel trimming process is required to prevent the bevel trimming process from affecting the device structure 310.

Figure 3D:
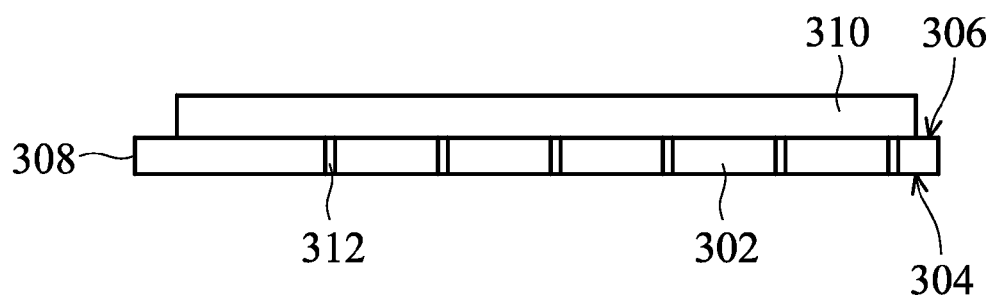
Figure 4B:
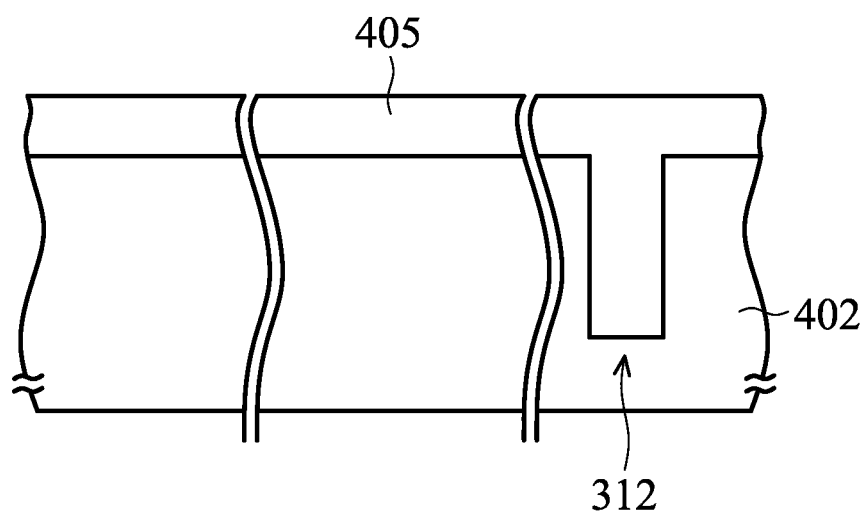
Figure 4C:
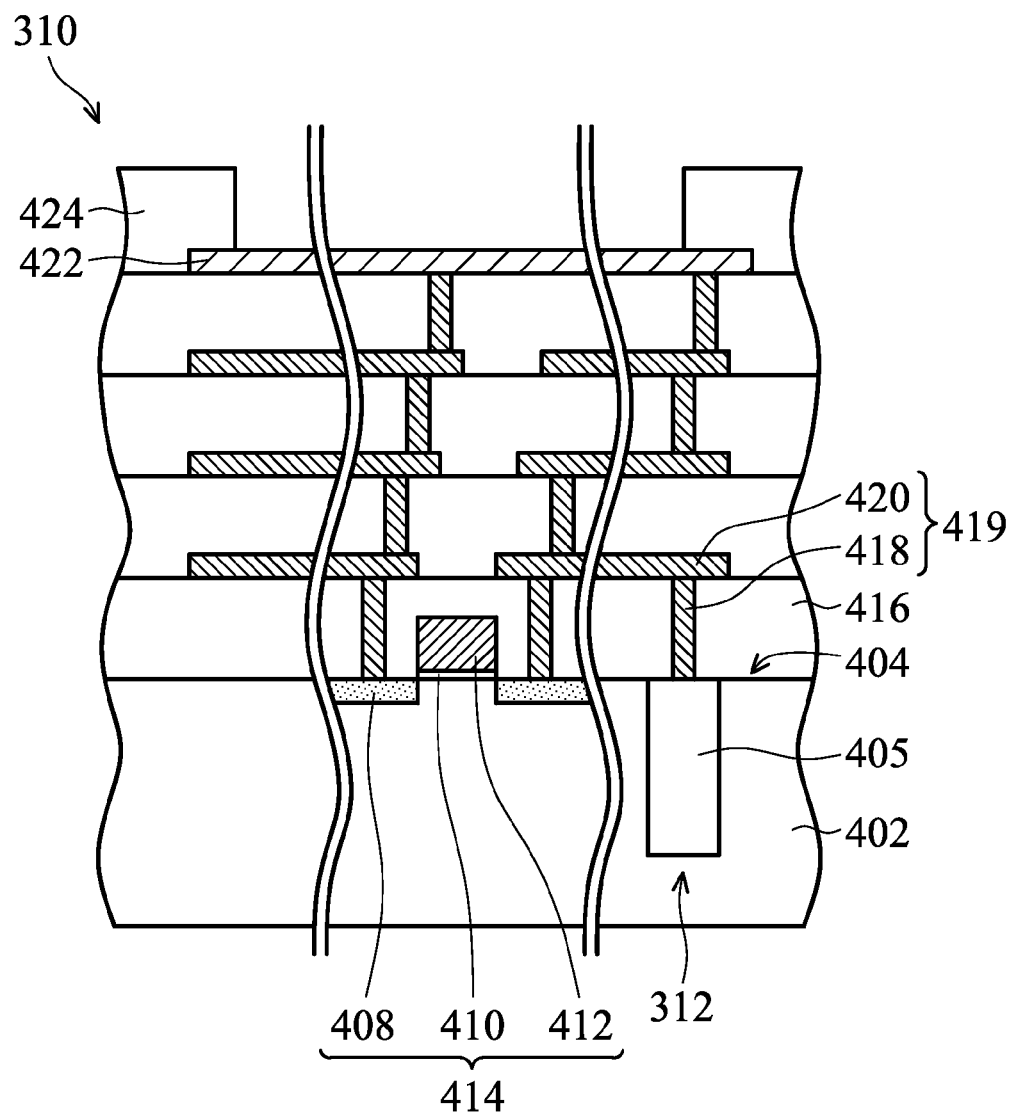

Referring to FIG. 3D, the substrate 302 is thinned by, for example grinding, at the back surface 304 till exposing the through substrate vias 312 (TSV). Since the edges 308 of the substrate 302 are treated to have a planar surface in the step of FIG. 3C, the substrate 302 can have a planar edge after thinning and the issue of the sharp edge of the substrate 302 can be eliminated. Thereafter, the substrate 302 can further be treated with a post cleaning process for insuring that the substrate 302 treated with the bevel trimming process is clean.

The substrate treated with the bevel trimming process before wafer thinning has advantages as follows. First, a sharp shape at edges after thinning is prevented, so that. A cracking issue due to sharp edges of the thinned wafer can be eliminated. Second, a substrate treated with the bevel trimming process is more flexible than cutting edges of the wafer which forms L shaped openings.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of bevel trimming a three dimensional (3D) semiconductor device, comprising:
   providing a substrate with stack layers thereon and through substrate vias (TSV) therein, wherein an edge of the substrate is curve shaped;
   performing a bevel trimming step to the curved edge of the substrate for obtaining a planar edge; and
   thinning the substrate to expose the through substrate vias, wherein thinning the substrate is performed after the bevel trimming step.

2. The method of bevel trimming a three dimensional semiconductor device as claimed in claim 1, wherein the planar edge of the substrate is perpendicular to a surface of the substrate.

3. The method of bevel trimming a three dimensional semiconductor device as claimed in claim 1, wherein the substrate is a wafer.

4. The method of bevel trimming a three dimensional semiconductor device as claimed in claim 1, wherein the bevel trimming step is a vertical grinding process (bevel polishing).

5. The method of bevel trimming a three dimensional semiconductor device as claimed in claim 1, wherein the step of thinning the substrate is accomplished by grinding.

6. The method of bevel trimming a three dimensional semiconductor device as claimed in claim 1, wherein the stack layers are layers of a device structure.

7. The method of bevel trimming a three dimensional semiconductor device as claimed in claim 6, wherein the stack layers comprise:
   a gate dielectric layer;
   a gate electrode overlying the gate dielectric layer;
   dielectric layers overlying the gate electrode; and
   an interconnect in the dielectric layers.

8. The method of bevel trimming a three dimensional semiconductor device as claimed in claim 7, wherein the interconnect comprises conductive lines and plugs.

9. The method of bevel trimming a three dimensional semiconductor device as claimed in claim 8, wherein the through substrate vias connect to one of the conductive lines or plugs.

10. The method of bevel trimming a three dimensional semiconductor device as claimed in claim 1, wherein the steps of forming the through substrate vias comprise:
    forming holes in the substrate; and
    forming a conductive layer on the substrate and filling the holes; and
    removing the conductive layer outside of the holes.

11. The method of bevel trimming a three dimensional semiconductor device as claimed in claim 1, further comprising performing a post cleaning process to the substrate.

12. A method for forming a three dimensional semiconductor device, comprising:
    providing a wafer with stack layers thereon and through substrate vias (TSV) therein, wherein an edge of the wafer is curve shaped;
    performing a bevel trimming step to the curved edge of the wafer for obtaining a planar edge; and
    thinning the wafer till exposing the through substrate vias, wherein the planar edge of the wafer is perpendicular to a surface of the wafer, wherein thinning the wafer is performed after the bevel trimming step.

13. The method for forming a three dimensional semiconductor device as claimed in claim 12, wherein the bevel trimming step is a vertical grinding process (bevel polishing).

14. The method for forming a three dimensional semiconductor device as claimed in claim 12, wherein the step of thinning the wafer is accomplished by grinding.

15. The method for forming a three dimensional semiconductor device as claimed in claim 12, wherein the stack layers comprise:
- a gate dielectric layer;
- a gate electrode overlying the gate dielectric layer;
- dielectric layers; and
- an interconnect in the dielectric layers.

16. The method for forming a three dimensional semiconductor device as claimed in claim 12, wherein the interconnect comprises conductive lines and plugs.

17. The method for forming a three dimensional semiconductor device as claimed in claim 16, wherein the through substrate vias connect to one of the conductive lines or plugs layer.

18. The method for forming a three dimensional semiconductor device as claimed in claim 12, wherein the steps of forming the through substrate vias comprise:
- forming holes in the wafer;
- forming a conductive layer on the wafer and filling the holes; and
- removing the conductive layer outside the holes.

19. The method for forming a three dimensional semiconductor device as claimed in claim 12, wherein the method avoids forming a sharp edge of the thinned wafer.

20. The method for forming a three dimensional semiconductor device as claimed in claim 12, further comprising performing a post cleaning process to the wafer.

* * * * *